(12) United States Patent
La Rosa et al.

(10) Patent No.: US 10,038,372 B2
(45) Date of Patent: Jul. 31, 2018

(54) METHOD AND DEVICE FOR CONTROLLING A CHARGE PUMP CIRCUIT

(71) Applicant: STMicroelectronics (Rousset) SAS, Rousset (FR)

(72) Inventors: Francesco La Rosa, Rousset (FR); Paola Cavaleri, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/363,631

(22) Filed: Nov. 29, 2016

(65) Prior Publication Data
US 2017/0302168 A1    Oct. 19, 2017

(30) Foreign Application Priority Data

Apr. 18, 2016    (FR) ...................... 16 53397

(51) Int. Cl.
    *H02M 3/07*    (2006.01)
(52) U.S. Cl.
    CPC ..................... *H02M 3/07* (2013.01)
(58) Field of Classification Search
    CPC ....................................................... H02M 3/07
    USPC ............................ 327/148, 157, 536; 363/59
    See application file for complete search history.

(56) References Cited

U.S. PATENT DOCUMENTS

| | | | |
|---|---|---|---|
| 6,091,282 A * | 7/2000 | Kim | ...................... H02M 3/073 327/536 |
| 2001/0038543 A1 | 11/2001 | Buck et al. | |
| 2007/0090871 A1* | 4/2007 | Kwak | ..................... H02M 3/07 327/536 |
| 2007/0103131 A1* | 5/2007 | Shin | ........................ H02M 3/07 323/280 |
| 2008/0031078 A1* | 2/2008 | Kang | ..................... G11C 5/145 365/233.1 |
| 2009/0219081 A1 | 9/2009 | Kwon et al. | |
| 2014/0340122 A1* | 11/2014 | Savanth | ............. G01R 19/0084 327/50 |
| 2016/0233770 A1* | 8/2016 | Arakawa | ............... H02M 3/158 |

FOREIGN PATENT DOCUMENTS

EP    0822477 A2    2/1998

* cited by examiner

*Primary Examiner* — William Hernandez
(74) *Attorney, Agent, or Firm* — Slater Matsil, LLP

(57) ABSTRACT

A charge pump circuit can be controlled by a control signal that is generated from a first signal coming from and output signal of the charge pump circuit, from a reference signal, and from a clock signal. The generation of the control signal includes a comparison of the reference signal and of the first signal in tempo with a timing signal coming from the clock signal.

22 Claims, 4 Drawing Sheets

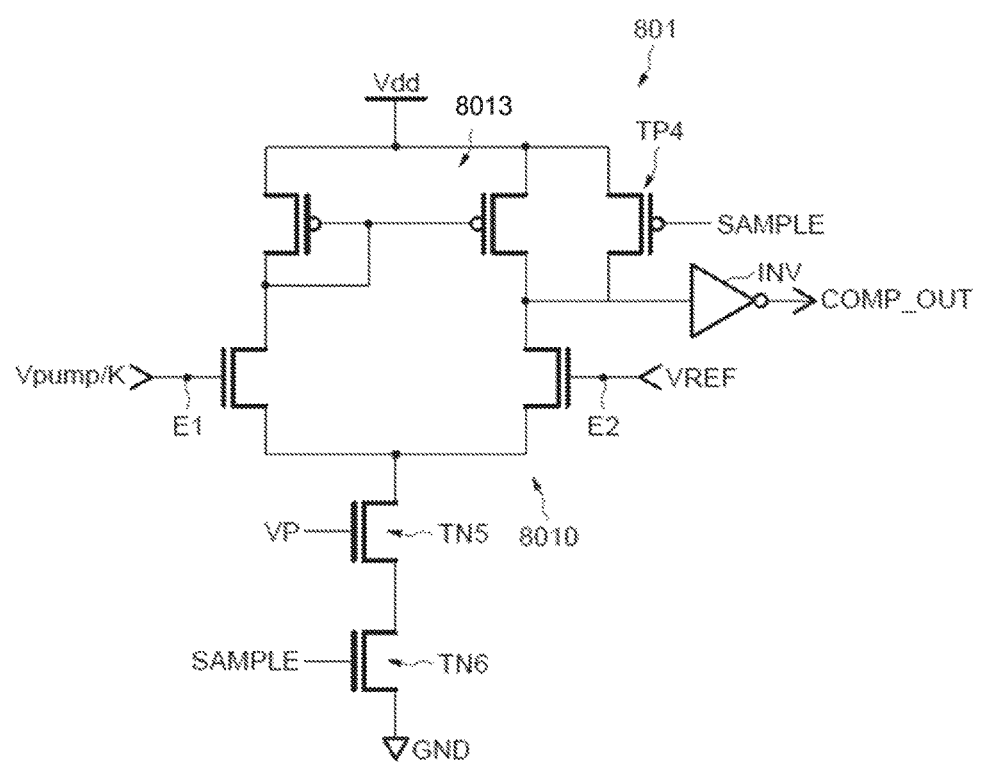

METHOD AND DEVICE FOR CONTROLLING A CHARGE PUMP CIRCUIT

CROSS-REFERENCE TO RELATED APPLICATIONS

This application claims priority to French Application No. 1653397, filed on Apr. 18, 2016, which application is hereby incorporated herein by reference.

TECHNICAL FIELD

Embodiments of the Invention relate to a method and device for controlling a charge pump circuit.

BACKGROUND

A charge pump is a kind of DC to DC converter that uses capacitors as energy-storage elements to create either a higher- or lower-voltage power source.

In some cases, a high voltage is generated from an external power supply which can vary between a low value, for example 1.55 volts and a high value, for example 3.6 volts. As a result, charge pump circuits are dimensioned to have the capacity to generate high voltage from the lowest value of the supply voltage.

Yet, this has consequences for the undulations of the regulated voltage obtained from high values of the supply voltage.

Indeed, it is then necessary to have regulations functioning at extremely high speed in order to ensure reasonable undulations of the level of high voltage delivered by the charge pump circuit from a high supply voltage value, while ensuring a minimum static consumption.

Yet, the conventional structures of charge pump control circuits do not allow for both rapid regulation (in order to minimize the undulations of the regulated voltage at the output of the charge pump) and a low consumption.

This is the case, for example, for the type of architecture of a device for controlling a charge pump circuit illustrated in FIG. 1.

More precisely, in this architecture of the prior art, the output voltage Vpump delivered by the charge pump circuit is looped back to an input of a logic gate 2 (typically an AND gate) via a voltage divider bridge 6 and a static comparator 7 which compares the voltage Vpump/K with a reference voltage VREF. The output signal of the comparator STOPPH is combined in the logic gate 2, with a clock signal Clock delivered by an oscillator 1. The output signal of the AND gate 2, referenced GCLK, is then shaped in a conventional shaping circuit 3 in order to deliver the control signal PUMPH of the charge pump circuit 4.

In such an architecture, the regulation is based on the path between the regulating signal STOPPH and the clock signal Clock. Furthermore, the regulation must be quick in order to avoid delays in the regulating loop which could cause spikes on the output voltage Vpump.

Yet, the comparator 7 is, in this case, a static comparator, in that it continuously carries out the comparison between the voltage Vpump/K and the reference voltage VREF.

Yet, high-speed comparators are not compatible with low consumption requirements.

SUMMARY

Implementation methods and embodiments of the invention relate to the control of a charge pump circuit/charge pump circuits. The invention is used in particular for, but is not limited to, the operations (reading, programming, erasing) carried out in non-volatile memories, in particular on-board flash memories, which require high voltages generated by one or more charge pump circuits.

Embodiments of the present invention provide charge pump control offering rapid regulation and a low current consumption typically well below 1 µA, for example approximately a few hundred nanoamps.

According to one aspect, a method for controlling at least one charge pump circuit is proposed. The method includes generation of a control signal from a first signal coming from the output signal of the charge pump circuit, from a reference signal and from a clock signal.

According to a general feature of this aspect, the generation of the control signal comprises a comparison of the reference signal and of the first signal in tempo with a timing signal coming from the clock signal.

Although the first signal can be the output signal itself of the charge pump circuit, the first signal is generally the output signal of the charge pump circuit reduced by a factor K after passing into a divider bridge.

Likewise, the timing signal can be the clock signal itself or, for example, a double period signal, for example after the clock signal passes into an edge detector.

Therefore, according to this aspect, the comparison of the reference signal and of the first signal is a dynamic comparison (as opposed to a static comparison carried out in the prior art), i.e., a comparison carried out solely at precise moments, in this case in tempo with the timing signal. As a result, the frequency of the timing signal can be high, corresponding to a rapid regulation, with a reduced consumption of the comparator since the latter only carries out the comparison operations at given moments and not continuously.

Whereas it would be possible to use a static comparator architecture and to activate the comparator solely in tempo with the timing signal, it is preferable, in order to obtain an even greater reduction in the current consumption, for the generation of the control signal to comprise, prior to the comparison, an initialization of a latch in an initial state, which initialization is carried out in tempo with first edges, for example the falling edges, of the timing signal (the initialization is therefore, for example, carried out during each low state of the timing signal) whereas the comparison is carried out in tempo with second edges (for example the rising edges) of the timing signal (the comparison is, therefore, carried out on each high state of the timing signal). The state of the latch is, then, optionally modified depending on the result of the comparison.

Therefore, not only is the comparison phase carried out only at given moments, but the switching of the latch only takes place in every other case, i.e., for example when the level of the first signal is less than the level of the reference voltage. As a result, there is a further decrease in the current consumption.

When the signal representing the result of the comparison includes short pulses, it is preferable, in order to prevent triggering the charge pump circuit twice in a row on the two edges of each pulse, to deliver the signal representing the result of the comparison to a toggle flip-flop so as to generate an intermediate signal that will possibly be shaped, in order to generate the control signal. This, then, allows each pulse of the signal representing the result of the comparison to be transformed into an edge which will allow a pump action to be triggered.

It then also becomes possible to control a first charge pump circuit by first edges, for example the rising edges, of the control signal and a second charge pump circuit by second edges, for example the falling edges, of the control signal.

According to another aspect, a device for controlling at least one charge pump circuit is proposed, which device comprises a first input for receiving a first signal coming from the output signal of the charge pump circuit, a second input for receiving a reference signal, a third input for receiving a clock signal and a control circuit configured to generate a signal for controlling the charge pump circuit.

According to a general feature of this other aspect, the control circuit comprises a comparison module configured to carry out a comparison of the reference signal and of the first signal in tempo with a timing signal coming from the clock signal.

According to an embodiment, the comparison module comprises a comparison stage and a latch connected to the comparison stage, a first controller is configured to initialize the latch in an initial state in tempo with first edges of the timing signal, and a second controller is configured to activate the comparison stage in tempo with second edges of the timing signal. The state of the latch can then be modified depending on the result of the comparison.

The control circuit can also include a detection unit configured to detect the edges of the clock signal and deliver the timing signal.

In this respect, the detection unit includes, for example, a monostable flip-flop delivering a pulse of the timing signal at each edge of the clock signal, the duration of each pulse being chosen so as to allow possible switching of the state of the latch.

According to an embodiment, the control circuit can comprise a toggle flip-flop connected to the output of the comparison module, so as to generate an intermediate signal which can be, for example, shaped within a shaping stage.

According to another aspect, an integrated circuit is also proposed which includes a control device such as defined above and at least one charge pump circuit suitable for being controlled by the control signal.

In an alternative, the circuit can include a first charge pump circuit suitable for being controlled by first edges of the control signal and a second charge pump circuit suitable for being controlled by second edges of the control signal.

BRIEF DESCRIPTION OF THE DRAWINGS

Other advantages and features of the invention will emerge upon examining the detailed description of implementation methods and embodiments, which description is in no way limiting, and the appended drawings in which:

FIG. 7 illustrates an example of a comparator stage.

DETAILED DESCRIPTION OF ILLUSTRATIVE EMBODIMENTS

Figure 1:
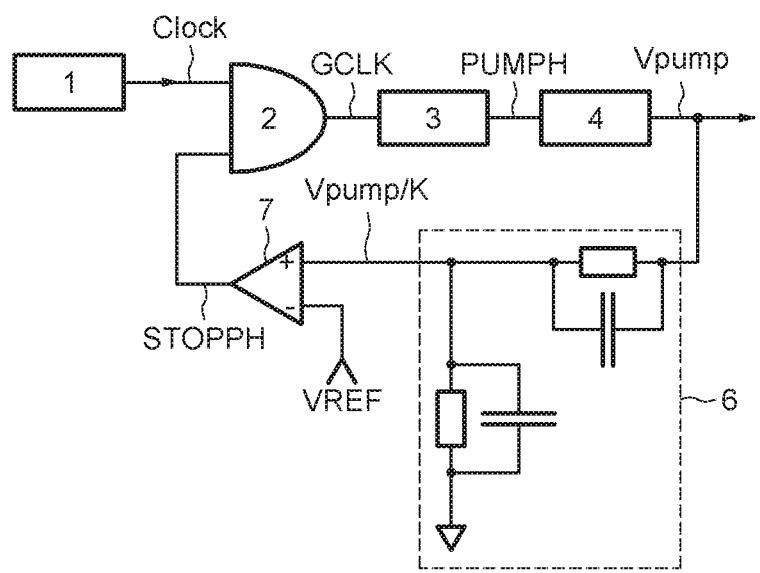
FIG. 1, which has already been described, illustrates a conventional architecture of a device for controlling a charge pump circuit.
Figure 2:
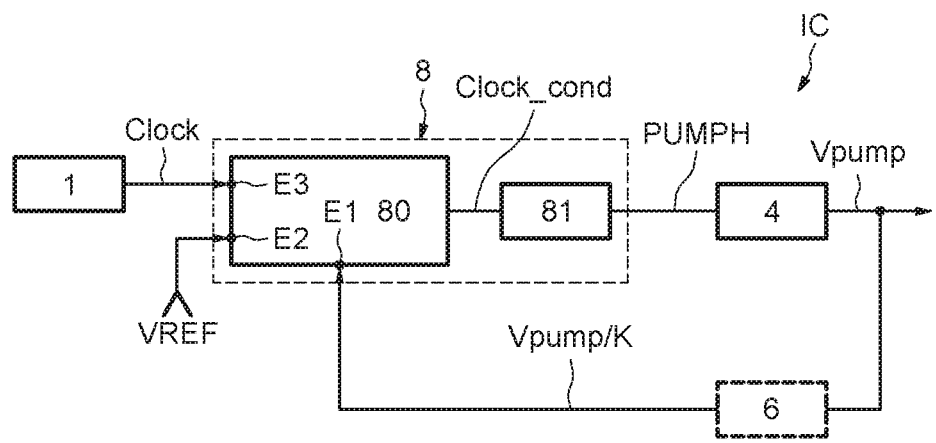
FIG. 2 illustrates a circuit according to an embodiment of the present invention.

In FIG. 2, the reference IC designates an integrated circuit incorporating a control circuit 8 configured to control a charge pump circuit 4, which is of conventional structure and known per se.

The control circuit 8 includes a first input E1 for receiving a first signal Vpump/K coming from the output signal Vpump of the charge pump circuit 4 after passing into a divider bridge 6.

The control circuit 8 also includes a second input E2 configured to receive a reference signal or voltage VREF and a third input E3 for receiving a clock signal Clock.

The control circuit 8 also includes a first stage 80 including the three inputs E1, E2 and E3 and which is configured to deliver an intermediate signal Clock_cond to a shaping stage 81, which is of conventional structure and known per se, which delivers the control signal PUMPH to the charge pump circuit 4.

The shaping circuit 81 includes, for example, buffer stages.

Figure 3:
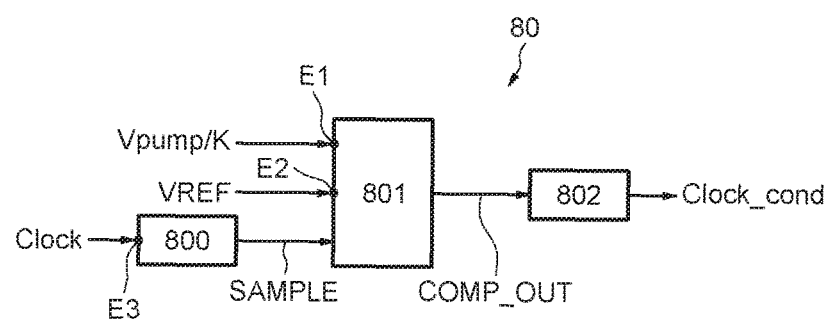
FIG. 3 illustrates a portion of the circuit of FIG. 2 in one embodiment.

As illustrated in FIG. 3, the first stage 80 includes, for example, a detection unit 800, the input E3 of which receives the clock signal Clock, which is configured to detect the edges of the clock signal and deliver a timing signal SAMPLE.

Figure 4:
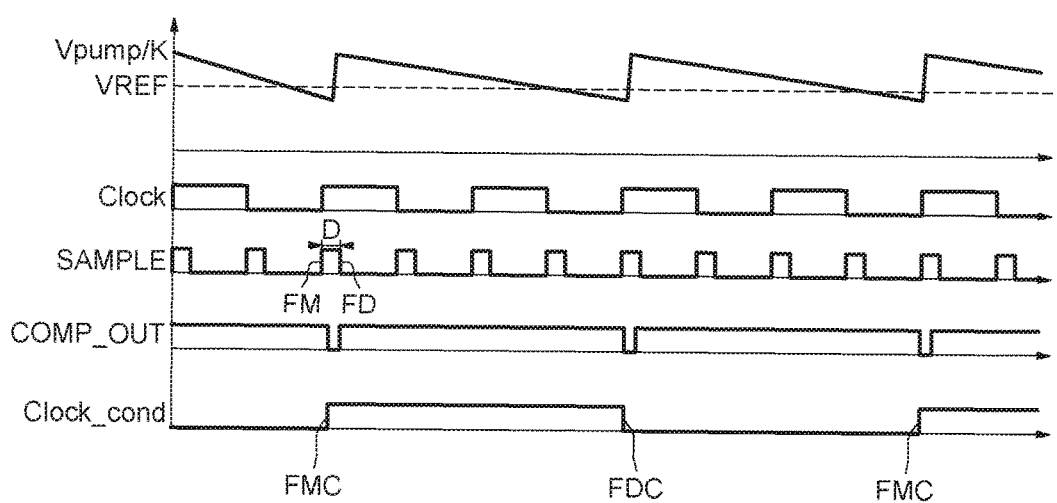
FIG. 4 illustrates a timing diagram.

Timing diagrams for the clock signal Clock and for the timing signal SAMPLE are illustrated in FIG. 4.

It can be seen that the timing signal SAMPLE includes a succession of pulses, the rising edges FM of which are synchronized with the edges of the clock signal Clock. Each pulse has a duration D separating the rising edge FM thereof from the falling edge FD thereof.

In this respect, the detection unit includes, for example, a monostable flip-flop which delivers a pulse of the timing signal SAMPLE at each edge of the clock signal and, as will be seen in greater detail hereafter, the duration D of each pulse is chosen so as to allow possible switching of the state of a latch during a comparison phase carried out in a comparison module 801.

More precisely, as illustrated in FIG. 3, this comparison module 801 receives, on the input E1, the first signal Vpump/K and, on the second input E2, the reference signal VREF. The rate of the comparison module is, furthermore, set by the timing signal SAMPLE and delivers a signal COMP_OUT representing the result of the comparison.

The signal COMP_OUT is delivered to a toggle flip-flop 802 which outputs the intermediate signal Clock_cond.

Before detailing the operation of the stage 80 and the progressions of the signals COMP_OUT and Clock_cond illustrated in FIG. 4, a more detailed description will now be given of an embodiment of the comparison module 801 by referring more particularly to FIG. 5.

The comparison module 801 comprises a comparison stage 8010 and a latch 8011 connected to the comparison stage 8010.

The comparison stage includes, in this case, two NMOS transistors, the gates of which form the inputs E1 and E2 for receiving the first signal Vpump/K and the reference signal VREF, respectively.

The nodes N3 and N4 of the comparison module are the nodes shared by the drains of the transistors of the comparison stage 8010 and by the latch 8011.

The sources of the transistors of the comparison stage 8010 are connected together at a node N5 which, itself, is connected to ground GND by a NMOS transistor TN1 controlled, on the gate thereof, by the timing signal SAMPLE.

The nodes N3 and N4 are, furthermore, connected together by a PMOS transistor TP1 also controlled on the gate thereof by the timing signal SAMPLE.

The latch, of conventional structure, includes two cross-coupled inverters. These two inverters are connected to the supply terminal Vdd. The output of the right-hand inverter in FIG. 5 forms the output node N2 of the comparison module and delivers the signal COMP_OUT.

Figure 5:
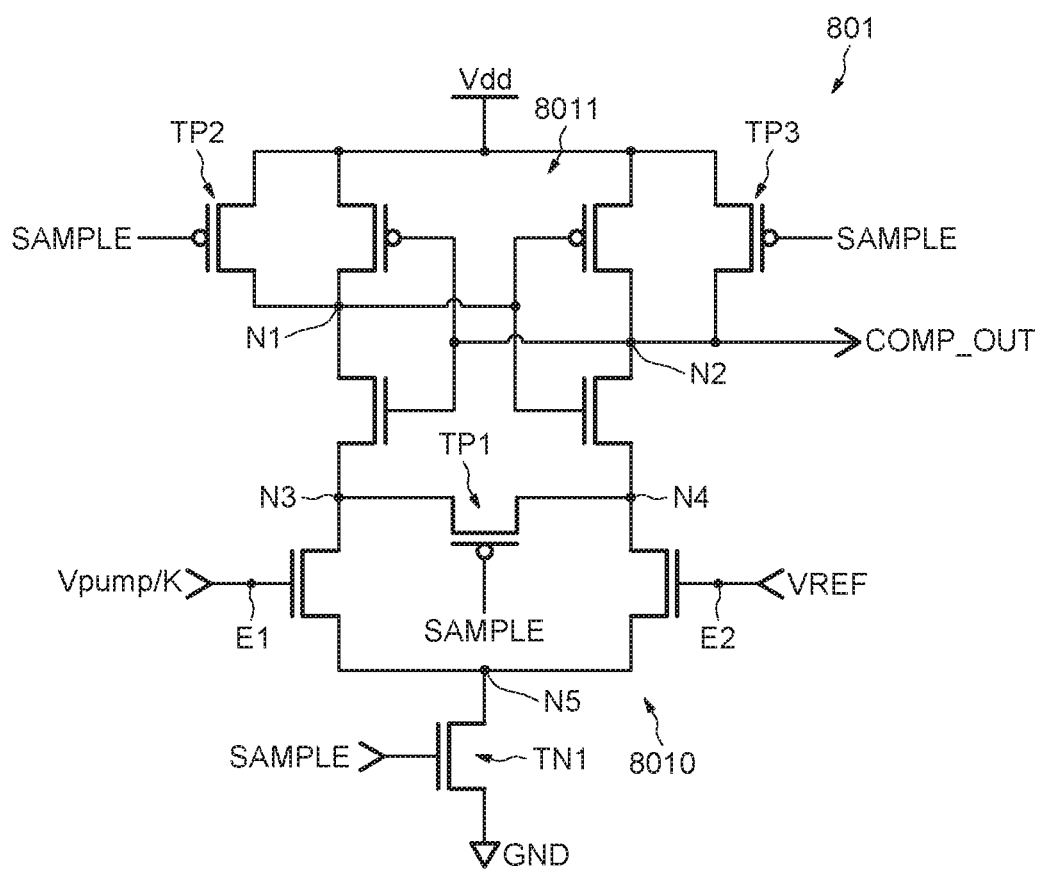
FIG. 5 illustrates an embodiment of a comparison module.

The node N2 is also connected to the supply terminal Vdd by a PMOS transistor TP3 controlled on the gate thereof by the timing signal SAMPLE while the node N1, which is the output of the left-hand inverter in FIG. 5, is connected to the supply terminal Vdd by another PMOS transistor TP2 and also controlled on the gate thereof by the timing signal SAMPLE.

The transistors TP1, TP2 and TP3 form, in this case, a first controller, which is configured to initialize the latch 8011 in an initial state in tempo with the falling edges of the timing signal SAMPLE, in this instance each time that the timing signal is in the low state (SAMPLE=0).

The transistor TN1 forms a second controller, which is configured to activate the comparison stage 8010 in tempo with the rising edges of the timing signal SAMPLE, i.e., each time that the signal SAMPLE is in the high state (SAMPLE=1).

More precisely, each occasion where the timing signal SAMPLE is 0 is a reset phase in which the transistors TP1, TP2 and TP3 are on and the transistor TN1 is off. The nodes N1 and N2 are pre-charged to the voltage Vdd while the nodes N3 and N4 are balanced.

In this initial state, the output signal COMP_OUT is 1.

Each occasion where the timing signal SAMPLE is 1 starts a comparison phase, in which the transistors TP1, TP2 and TP3 are, on this occasion, off while the transistor TN1 is on, grounding the node N5.

The voltages at the nodes N3 and N4 drop with a different speed depending on whether the voltage VREF is greater or smaller than the voltage Vpump/K. The same applies to the voltages at the nodes N1 and N2.

Therefore, if the voltage Vpump/K is less than the voltage VREF, then the latch switches into the state "0" and the signal COMP_OUT assumes the value "0".

Otherwise, the latch does not switch and the signal COMP_OUT remains in the state 1.

The progression of these signals is shown in the bottom part of FIG. 4.

It is, therefore, seen that, in response to the rising edge of the timing signal SAMPLE, the signal COMP_OUT changes to the low state if the reference voltage VREF becomes greater than the voltage Vpump/K.

The signal COMP_OUT comes back up to the state 1 upon the occurrence of the falling edge FD of the timing signal SAMPLE which marks the start of resetting the memory "0" of the comparison module.

The response time of the comparison module, i.e., the duration between the occurrence of a rising edge FM of the timing signal SAMPLE and the occurrence of a falling edge of the signal COMP_OUT is in the nanosecond range.

As indicated above, the duration D of each pulse of the timing signal SAMPLE has been chosen so as to allow the comparison operation and the possible change of state of the latch. By way of illustration, it will be possible to choose a duration D equal to 1 nanosecond, this duration being less than a half-period of the clock signal.

The comparison module is advantageously produced with small transistors having low capacitive values, which leads to low current consumption during the possible switching of the latch.

The use of a latch is, indeed, advantageous since the only consumption of the comparison module takes place during the switching of the state of this latch.

Therefore, by way of illustration, a timing signal frequency of 256 MHz results in an average current consumption of a few hundred nanoamps, which is much less than the consumption of a high-speed static comparator which can reach a few dozen microamps.

The charge pump circuit 4 is a circuit of conventional architecture and which is known per se. Generally, a charge pump circuit architecture comprises one or more capacitive stages allowing, by successive charging of the capacitors, a voltage greater than the input voltage to be obtained at output. Depending on the type of architecture, the charge pump circuit can be controlled by a control signal (such as, for example, in the Dickson charge pumps) or by the control signal and the additional control signal.

In order to prevent a charge pump action at each edge of the signal COMP_OUT, this signal is advantageously delivered to the toggle flip-flop 802, which allows the intermediate signal Clock_cond to be obtained, which signal has a rising edge FMC or falling edge FDC at each occurrence of a pulse of the signal COMP_OUT.

The control signal PUMPH controlling the charge pump circuit 4 has, after shaping in the shaping stage 81, edge occurrences similar to those of the intermediate signal Clock_cond.

It would then be possible to provide a charge pump action at each rising or falling edge of the signal PUMPH.

Figure 6:
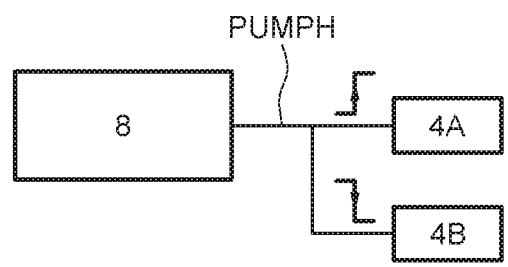
FIG. 6 illustrates in alternative embodiment.

However, as an alternative, as illustrated in FIG. 6, it is possible to provide two charge pump circuits 4A and 4B controlled by the rising edges and the falling edges, respectively, of the control signal PUMPH.

More precisely, in this case, the charge pump circuit 4A carries out a charge action at each rising edge of the signal PUMPH while it is the charge pump circuit 4B which carries out a pump action at each falling edge of the control signal PUMPH.

The invention is not limited to the embodiments and implementation methods which have just been described but covers all the alternatives thereof.

Therefore, although it is particularly advantageous, as has been described above, to use a comparison module including a comparator stage combined with a latch, it would be possible to use, as illustrated in FIG. 7, a static comparator stage activated dynamically, i.e., in tempo with the rising edges of the timing signal SAMPLE.

The current consumption of such a comparator would remain less than That of a static comparator continuously carrying out the comparison between the first signal Vpump/K and the reference signal VREF.

More precisely, as illustrated in FIG. 7, such a comparator comprises a conventional comparison stage 8010 based on two MOS transistors, the gates of which form the two inputs E1 and E2, and which is connected to the supply voltage Vdd by a current mirror structure 8013.

The sources of the two transistors of the comparator stage are connected together to ground GND by a first NMOS transistor TN5 controlled, on the gate thereof, by a bias voltage VP and by a second NMOS transistor TN6 connected, on the gate thereof, by the timing signal SAMPLE.

The output of the comparator is connected to an inverter INV which delivers the signal COMP_OUT.

Moreover, a PMOS transistor TP4, controlled on the gate thereof by the timing signal SAMPLE, is connected between the supply terminal Vdd and the input of the inverter INV.

Therefore, when the timing signal SAMPLE is in the low state, the comparator is inactive and the input of the inverter is forced to the voltage Vdd, which forces the output of the signal COMP_OUT to the low state.

However, when the timing signal SAMPLE is in the high state, the comparator stage is active and can carry out the comparison between the signals Vpump/K and VREF so as to deliver the signal COMP_OUT having the value "0" or "1" depending on the result of the comparison.

What is claimed is:

1. A method for controlling a charge pump circuit, the method comprising:
   receiving a first signal based on an output signal of the charge pump circuit;
   receiving a reference signal;
   receiving a clock signal; and
   generating a control signal by comparing the reference signal and the first signal, the comparing being synchronized with a timing signal that is based on the clock signal, wherein generating the control signal further comprises initializing a state of a latch to an initial state prior to comparing the reference signal and the first signal, wherein the initializing is synchronized with first edges of the timing signal and the comparing is synchronized with second edges of the timing signal.

2. The method according to claim 1, further comprising modifying the state of the latch depending on a result of the comparing.

3. The method according to claim 1, wherein generating the control signal comprises detecting edges of the clock signal.

4. The method according to claim 1, further comprising generating the timing signal based upon edges of the clock signal.

5. The method according to claim 4, wherein the timing signal has a frequency that is twice the frequency of the clock signal.

6. A method for controlling a charge pump circuit, the method comprising:
   receiving a first signal based on an output signal of the charge pump circuit;
   receiving a reference signal;
   receiving a clock signal; and
   generating a control signal by comparing the reference signal and the first signal, the comparing being synchronized with a timing signal that is based on the clock signal, wherein generating the control signal comprises generating a signal representing a result of comparing the reference signal and the first signal and delivering the result to a toggle flip-flop so as to generate an intermediate signal.

7. The method according to claim 6, wherein generating the control signal comprises a shaping of the intermediate signal.

8. A method for controlling a charge pump circuit, the method comprising:
   receiving a first signal based on an output signal of the charge pump circuit;
   receiving a reference signal;
   receiving a clock signal; and
   generating a control signal by comparing the reference signal and the first signal, the comparing being synchronized with a timing signal that is based on the clock signal, wherein controlling the charge pump circuit comprises controlling a first charge pump circuit by first edges of the control signal and controlling a second charge pump circuit by second edges of the control signal.

9. A device for controlling a charge pump circuit, comprising:
   a first input configured to receive a first signal from an output of the charge pump circuit;
   a second input configured to receive a reference signal;
   a third input configured to receive a clock signal; and
   a control circuit configured to generate a signal to control the charge pump circuit, the control circuit comprising a comparison module configured to carry out a comparison of the reference signal and of the first signal in synchronization with a timing signal coming from the clock signal, wherein the control circuit comprises a toggle flip-flop coupled to the output of the comparison module so as to generate an intermediate signal.

10. The device according to claim 9, wherein the comparison module comprises a comparison stage and a latch coupled to the comparison stage.

11. The device according to claim 10, wherein the control circuit is configured to initialize a state of the latch to an initial state in synchronization with first edges of the timing signal, and to activate the comparison stage in synchronization with second edges of the timing signal.

12. The device according to claim 11, further comprising modifying the state of the latch depending on a result of the comparison.

13. The device according to claim 9, wherein the control circuit comprises a detection unit configured to detect edges of the clock signal and to deliver the timing signal.

14. The device according to claim 13, wherein the comparison module comprises a latch and wherein the detection unit comprises a monostable flip-flop configured to deliver a pulse of the timing signal at each edge of the clock signal, each pulse having a duration chosen so as to allow possible switching of a state of the latch.

15. The device according to claim 14, wherein the duration is lower than half-period of the clock signal.

16. The device according to claim 9, wherein the control circuit comprises a shaping stage configured to shape the intermediate signal.

17. The device according to claim 9, wherein the control circuit consumes less than 1 uA.

18. The device according to claim 9, wherein the comparison module comprises:
   a first transistor coupled between the current mirror and a first node, the first transistor having a control node configured to receive the first signal;
   a second transistor coupled between the current mirror and the first node, the second transistor having a control node configured to receive the reference signal;
   a third transistor coupled between the first node and a reference node, the third transistor having a control node configured to receive a bias voltage; and
   a fourth transistor coupled between the third transistor and the reference node, the fourth transistor configured to receive the timing signal.

19. The device of claim 18, wherein the comparison module further comprises:
   a fifth transistor coupled to the second transistor, the fifth transistor having a control node configured to receive the timing signal; and
   an inverter coupled between the fifth transistor and the output of the comparison module.

20. An integrated circuit comprising:
a charge pump circuit;
a control circuit coupled to the charge pump circuit, the control circuit comprising a comparison module configured to carry out a comparison of a reference signal and a first signal from an output of the charge pump circuit in synchronization with a timing signal coming from a clock signal; and
a second charge pump circuit coupled to the control circuit, wherein the control circuit is configured to generate a control signal configured to control the charge pump circuit and the second charge pump circuit, wherein the charge pump circuit is configured to be controlled by first edges of the control signal and the second charge pump circuit is configured to be controlled by second edges of the control signal.

21. The integrated circuit according to claim 20, further comprising an oscillator with an output coupled to the control circuit to provide the clock signal.

22. The integrated circuit according to claim 20, further comprising a voltage divider circuit coupled between the output of the charge pump circuit and the control circuit, the first signal coupled being coupled to the control circuit through the voltage divider circuit.

* * * * *

UNITED STATES PATENT AND TRADEMARK OFFICE
CERTIFICATE OF CORRECTION

PATENT NO. : 10,038,372 B2  
APPLICATION NO. : 15/363631  
DATED : July 31, 2018  
INVENTOR(S) : Francesco La Rosa Page 1 of 1

It is certified that error appears in the above-identified patent and that said Letters Patent is hereby corrected as shown below:

In the Claims

Column 8, Lines 47-48, Claim 18, delete "wherein the comparison module comprises:" and insert --wherein the comparison module comprises: a current mirror;--.

Signed and Sealed this  
Eighteenth Day of September, 2018

Andrei Iancu  
*Director of the United States Patent and Trademark Office*